United States Patent [19]

Grzybowski

[11] 4,218,694
[45] Aug. 19, 1980

[54] RECTIFYING APPARATUS INCLUDING SIX SEMICONDUCTOR DIODES SANDWICHED BETWEEN CERAMIC WAFERS

[75] Inventor: James P. Grzybowski, West Bloomfield, Mich.

[73] Assignee: Ford Motor Company, Dearborn, Mich.

[21] Appl. No.: 954,008

[22] Filed: Oct. 23, 1978

[51] Int. Cl.² .................. H01L 23/32; H01L 23/02; H01L 23/12
[52] U.S. Cl. ....................................... 357/76; 357/74; 357/75; 357/80; 357/79; 357/81
[58] Field of Search .................. 357/74, 75, 76, 80, 357/81, 79

[56] References Cited

U.S. PATENT DOCUMENTS

| 2,994,121 | 8/1961 | Shockley | 357/76 |
|---|---|---|---|
| 3,018,425 | 1/1962 | Wagner | 357/76 |
| 3,133,336 | 5/1964 | Marinace | 357/76 |
| 3,134,935 | 5/1964 | Parsons et al. | 357/76 |
| 3,158,927 | 12/1964 | Saunders | 357/76 |
| 3,383,760 | 5/1968 | Shwartzman | 357/76 |
| 3,593,107 | 7/1971 | Chilton et al. | 357/76 |
| 3,646,408 | 2/1972 | Kastner | 357/74 |
| 3,648,121 | 3/1972 | Suenaga et al. | 357/76 |
| 3,649,881 | 3/1972 | Chang et al. | 357/76 |
| 3,697,814 | 10/1972 | Christman et al. | 357/76 |

Primary Examiner—Andrew J. James
Attorney, Agent, or Firm—Peter Abolins; Clifford L. Sadler

[57] ABSTRACT

This specification discloses a semiconductor assembly having a semiconductor device sandwiched between two ceramic layers which have a good heat transfer capability and provide for transfer of heat from the semiconductor device through each of the ceramic wafers. The semiconductor assembly can include a plurality of rectifying devices placed between two selectively metalized ceramic wafers and joined to form a semiconductor rectifier for the output of an alternator.

1 Claim, 6 Drawing Figures

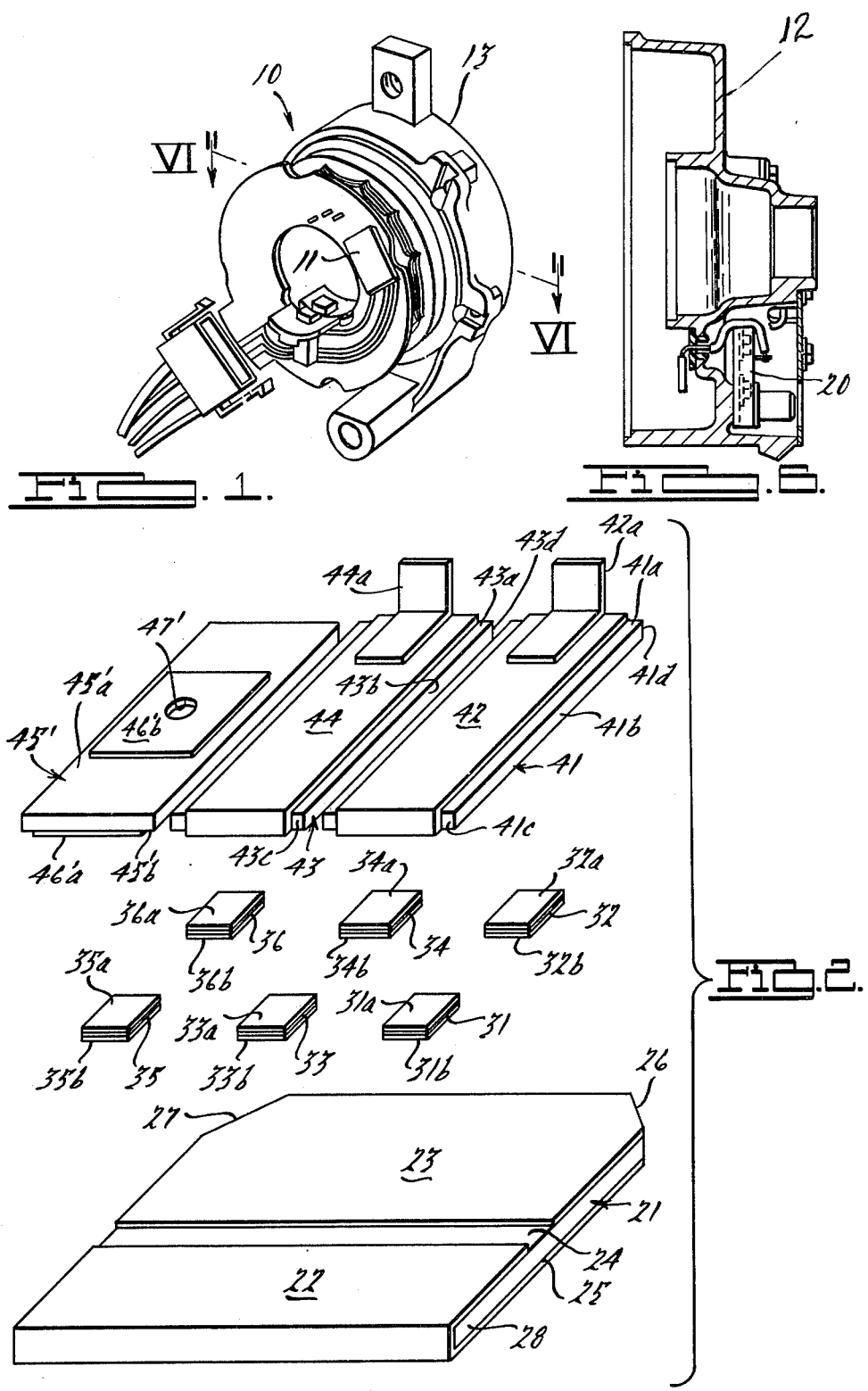

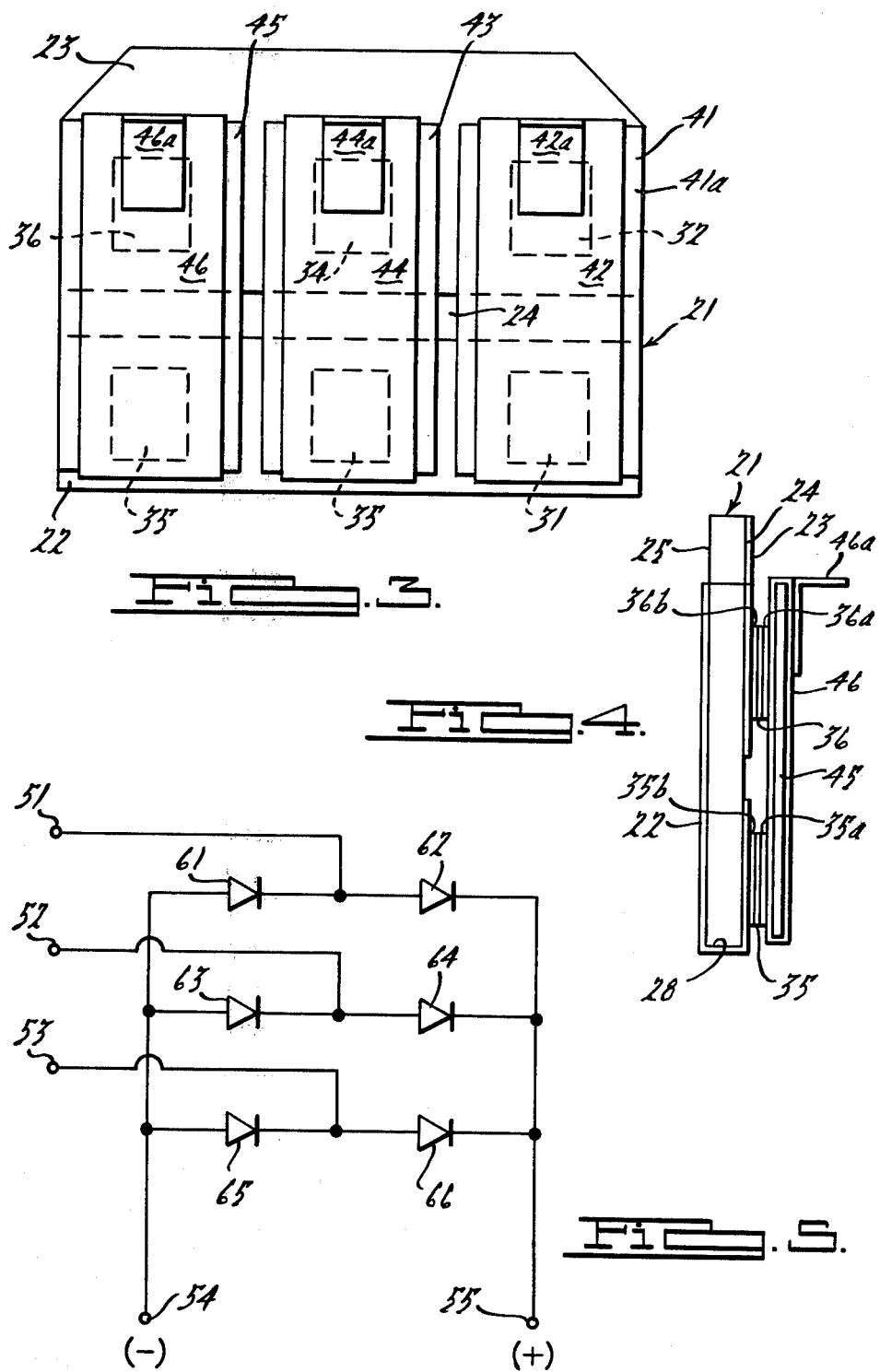

RECTIFYING APPARATUS INCLUDING SIX SEMICONDUCTOR DIODES SANDWICHED BETWEEN CERAMIC WAFERS

BACKGROUND OF THE INVENTION

(1) Field of the Invention

This invention relates to semiconductors and, more particularly, to semiconductor structures and methods of using the same.

(2) Prior Art

In known alternators for automobiles, the full wave rectifier associated with the alternator typically takes up a substantial portion of the volume of the alternator. This is both because of the structure of the components of the rectifiers and the need for having a sufficiently large cooling surface. Cooling is a sufficiently important problem that automobile alternators typically have fans for forcing air through the alternator.

A typical prior art rectifier makes use of individually mounted and packaged semiconductor diodes which are then wired to form the full wave rectifier. A typical mounting for each diode is a "can" which is a generally cup-shaped metal housing wherein is positioned a piece of preformed solder, a semiconductor diode chip, another piece of preformed solder and an external connection. The open end of the can is sealed so that the external connection extends out of the can. There is sufficient internal space in the can to allow for expansion and contraction of the lead. Typically, the cost of the functional element, the semiconductor chip, is a relatively small fraction of the total cost of the can. That is, the packaging accounts for a substantial portion of the total cost of each can.

Another method of packaging a semiconductor rectifier chip is in the "button" form. A pair of conductive leads having flatten ends each abut preformed solder connections which contain therebetween the semiconductor chip. By heating this construction, the solder flows and connects the semiconductor chip to the leads. The entire assembly is then coated in epoxy to seal the interior. With the "button" construction as with the aforementioned "can" construction, the package contains only one semiconductor rectifier chip. Thus, further fabrication is necessary to assemble these chips into a rectifier suitable for use with an alternator.

Various other prior art structures are known for mounting semiconductor rectifier chips. For example, it is known to start with a ceramic base, mount the semiconductor chip on the ceramic base and then cap the semiconductor chip so thate is an air space on one side of the semiconductor chip. The structure has a disadvantage in that air is a poor heat conductor and most of the heat generated within the semiconductor chip must be dissipated through the ceramic base. Typically, in an automobile environment, it is difficult for such an arrangement to provide sufficient heat dissipation.

It would be desirable to have a simple full wave rectifier structure which is easily fabricated and readily cooled. These are some of the problems this invention overcomes.

SUMMARY OF THE INVENTION

This invention recognizes that in the countinuing effort to reduce the weight of the automobile, to improve gas mileage, to reduce the cost of fabricating the automobile, and to simplify the construction of the automobile, it is particularly advantageous to reduce the size and weight of the rectifier assembly. When such size and weight reduction takes place, it is possible to install the voltage regulator within the housing of the alternator. This provides such additional benefits such as reducing the need to separately install the voltage regulator during assembly of the automobile and for eliminating the need for installation of the wiring harness connecting the voltage regulator to the alternator.

This invention teaches a full wave voltage rectifier sufficiently small, rugged and dependable for use in automobile generators which provides the aforementioned advantages. Further, the rectifier eliminates the conventional circuit board. Also, there is a reduction in the likelihood of a salt bridging problem due to road salts causing electrical shorting because of the ability to install the rectifier in an isolated area of the alternator housing.

This invention recognizes that a semiconductor assembly can be fabricated by having a semiconductor device sandwiched between an upper and lower ceramic base which has a sufficiently high heat transfer capability to cool the semiconductor device and provide for transfer of heat from the semiconductor device through the upper and lower ceramic bases. In a particular embodiment of this invention, six semiconductor wafers are mounted between two selectively metallized ceramic bases to provide a full wave rectifier for an alternator. This structure is particularly advantageous in that not only is its fabrication relatively simple but heat transfer is greatly improved.

In a particular embodiment, a semiconductor full wave rectifier assembly includes a generally planar first lower ceramic base having two opposing major surfaces. The first lower ceramic base includes a first metallization covering a portion of both of the major surfaces. A first, second and third semiconductor device are connected to the first metallization and a fourth, fifth and sixth semiconductor device are connected to the second metallization. A second, third and fourth generally planar upper ceramic bases each have two opposing major surfaces and each have metallization on at least one of the two major surfaces. The second upper ceramic base is positioned so its associated metallization contacts the first and second diodes, the third upper ceramic base is positioned so it is contacting the third and fourth diodes and the fourth ceramic base is positioned so that it contacts the fifth and sixth diodes. The metallizations on the second, third and fourth ceramic bases are adapted to receive the three phases of the alternator output and the first and second metallizations on the first ceramic base are adapted to provide a DC output from the rectifier. The positioning of ceramic bases on both sides of each of the diodes provides for heat transfer in two opposing directions.

The use of ceramic in conjuction with silicon is particularly advantageous because the thermal expansion rates are similar thus reducing the failure rate. That is, similar rates of expansion eliminate stress which would otherwise be present when there are different rates of expansion which is particularly advantageous in an automobile environment where there are substantial temperature changes. In the particular embodiment discussed above, wherein there are six semiconductor rectifier ships used in conjunction with the ceramic wafers, encapsulation of all six diodes can be done at the same time instead of individually as in the prior art. However, because one of the diodes in the assembled six diode package may be defective, it is particularly advantageous that one of the upper ceramic bases can be removed without disturbing the other two upper ceramic bases to replace the defective diode. If the upper ceramic base were a single piece and had to be removed, thus once again exposing all six diodes to heat, there is a greater chance that the repaired rectifier would have a new fault than when only one of three upper ceramic bases is removed.

BRIEF DESCRIPTION OF THE DRAWINGS

FIG. 1 is a perspective view of a partly exploded alternator with a front portion of the housing removed to expose a rectifier and regulator mounted on the rear housing in accordance with an embodiment of this invention;

FIG. 2 is an exploded perspective view of a rectifier in accordance with an embodiment of this invention with two different upper ceramic base embodiments for external connection;

FIG. 3 is a top plan view of an assembled full wave rectifier in accordance with an embodiment of this invention;

FIG. 4 is a side elevation view of the embodiment shown in FIG. 3;

FIG. 5 is a schematic diagram of the full wave rectifier shown in FIGS. 2 and 3; and FIG. 6 is a partial sectional view taken substantially along line VI—VI of FIG. 1.

DESCRIPTION OF THE PREFERRED EMBODIMENT

Referring to FIGS. 1 and 6, an alternator 10 includes a rectifier 20 which is sufficiently small so that a voltage regulator 11 can also be positioned within a rear housing 12. Advantageously, there is a removable access port so rectifier 20 can be easily reached from outside alternator 10. By positioning voltage regulator 11 within alternator 10, it is possible to eliminate external wiring harnesses between rectifier 20 and regulator 11. The assembly of alternator 10 as shown has an improved cooling, reduced assembly labor, and a weight reduction which is advantageous for increasing fuel mileage.

Referring to FIG. 2, the exploded view shows a ceramic base layer 21 with metallizations 22 and 23 and top ceramic layers 41, 43 and 45. Ceramic layer 45' is an alternative embodiment of a ceramic layer 45, shown in FIGS. 3 and 4, which is similar to ceramic layers 41 and 43. Similar features of ceramic layer 45 and 45' use the same numbering with the addition of a prime ('). Six rectifier chips or semiconductor diodes 31, 32, 33, 34, 35 and 36 are shown positioned for mounting in a checker board pattern between the ceramic base layer 21 and the top ceramic layers 41, 43 and 45'. To facilitate assembly as later discussed, semiconductor diodes 31 through 36 have an associated top solder piece 31a through 36a, respectively, and a bottom solder piece 31b through 36b, respectively.

Referring to FIGS. 2, 3 and 4, ceramic base layer 21 is a generally rectangular planar wafer having a major surface 24 facing the rectifier chips and a major surface 25 facing away from the rectifier chips. Ceramic base layer 21 also includes two truncated corners 26 and 27 which facilitate the fit of rectifier 20 within rear housing portion 12 of alternator 10. Wrapped metallization 22 extends across about one-third of the area of major surface 24, down a forward edge 28 of ceramic base layer 21 connecting major surfaces 24 and 25, and across the entire major surface 25. Metallization 23 is spaced from metallization 22 on major surface 24 and extends across the face of major surface 24 between corners 26 and 27.

Top ceramic layer 41 is a rectangular wafer which has a major surface 41a facing away from rectifier chips 31 and 32 and a major surface 41b facing toward rectifier chips 31 and 32. A metallization 42 extends like a continuous belt around ceramic layer 41 and goes across major surface 41a down a front edge 41c, across major surface 41b and up a rear edge 41d, opposite from edge 41c, back to major surface 41a. Metallization 42 includes a contact 42a which is generally L-shaped having one leg attached to metallization 42 and another leg extending away from metallization 42 for connection to an external lead. A top ceramic layer 43 is analogous to top ceramic layer 41 and includes surfaces 43a, 43b, edges 43c and 43d. A metallization 44 corresponds to metallization 42 and includes a contact 44a.

FIG. 2 also shows an alternative embodiment of a top ceramic layer 45' which is generally rectangular and planar, with a major top surface 45'a and a major bottom surface 45'b. A metallization 46'a extends along major surface 45'b but does not extend up the edges of top ceramic layer 45'. Top major surface 45'a has a metallization 46'b. An opening 47' extends through metallization 46'b, and top ceramic layer 45' so that a lead can be extended through ceramic layer 45' to contact metallization 46'a. A metallization such as 46' may be desirable when fabricating a belt-like metallization such as 42 is difficult.

The use of a metallization such as 46 instead of a metallization such as 46'a and 46'b is advantageous because the contact to metallization 46 has two conductive paths to rectifier chips 35 and 36. That is, current flowing through contact 46a can go around metallization 46 at edge 45c and 45d. In contrast, all current flowing to metallization 46'a must pass through the lead going to opening 47'. Such reduced resistance is particularly desirable because it reduces the power loss, defined by the square of the current times the resistance, and thus reduces heating which is known to be a significant problem in rectifiers for use in alternators in automobiles.

Referring to FIG. 3, the longitudinal length of ceramic layers 41, 43 and 45 is sufficiently short to fit within the boundary of ceramic base layer 21. Similarly, the combined widths of ceramic layers 41, 43 and 45 is also sufficiently narrow to fit within the boundary of ceramic base layer 21.

Rectifier chips 31 and 32 are spaced and positioned to fit between top ceramic layer 41 and ceramic base layer 21. Top solder piece 31a of rectifier chip 31 contacts metallization 42 and bottom solder piece 31b of rectifier chip 31 contacts metallization 22. Top solder piece 32a of rectifier chip 32 contacts metallization 23. Similarly, rectifier chips 33 and 34 are associated with top ceramic layer 43. Top solder piece 33a of rectifier chip 33 is in contact with metallization 44 and bottom solder piece 33b is in contact with metallization 22. Top solder piece 34a of rectifier chip 34 is in contact with metallization 23. Diodes 35 and 36 are associated with top ceramic layer 45; diode 35 has top solder piece 35a associated with metallization 46 and bottom solder piece 36b with metallization 22; and diode 36 has top solder piece 36a associated with metallization 46 and bottom solder piece 36b with metallization 23. External connection to both metallizations 22 and 23 is made by leads attached to those metallizations.

Referring to FIG. 5, the electrical circuitry formed by the embodiment shown in FIGS. 2, 3 and 4 is a three phase bridge circuit for use with a three phase alternator. Three input terminals 51, 52 and 53 are provided for application of a three phase alternating current source and two output terminals 54 and 55, negative and positive terminals respectively, are provided for supplying direct current to a load such as the electrical load of an automobile. The bridge circuit includes three pairs of rectifier diodes (61 and 62, 63 and 64 and 65 and 66). Each diode of a pair of rectifier diodes is connected in series with the other of the pair between the negative and positive direct current terminals 54 and 55 in such a manner as to pass conventional current in the direction from the negative terminal 54 to the diode, through the alternating current source, and to positive terminal 55. Each of the alternating current terminals 51, 52 and 53 are electrically connected at a point between the two diodes of their respective pairs. That is, alternating current terminal 51 is electrically connected between rectifier diodes 61 and 62, alternating current of terminal 52 is connected between rectifier diodes 63 and 64 and alternating current terminal 53 is connected between rectifier diodes 65 and 66. Thus, a three phase rectifier bridge circuit is formed.

In fabricating rectifier 20, ceramic layers 21, 41, 43 and 45 are formed of a material such as beryllia. Beryllia is particularly desirable because it is electrically insulating and has a high heat conductivity. Another material which also can be used but has a somewhat decreased heat transfer capability is alumina. A molybdenum manganese paste is applied to the ceramic and fired on at the positions where metallizations are desired. Copper is electroplated onto the molybdenum manganese and serves to provide an improved conductive layer. That is, the molybdenum manganese is less conductive than the copper but acts as an expansion buffer to accomodate the difference in expansion rates between the copper and the ceramic layer and the semiconductor chip. Typically, the circuit configuration of the metallization on a ceramic layer is formed by selectively masking the copper and molybdenum manganese and then etching off the exposed metallization so that metallization remains only where it is desired.

Solder pieces 31a through 36a and 31b through 36b are positioned between the metallization and associated rectifier chips 31 through 36 and the entire assembly is heated to electrically connect all the components as desired. Typically, a seal is then formed around the assembled package using a material such as an epoxy base resin. For example, metallized ceramic base layer 21 can be epoxied to an aluminum housing with high thermal conductivity epoxy. Typically, when rectifier 20 is mounted in alternator 10, one ceramic plate, such as ceramic base layer 21, is mounted to rear housing portion 12 and cooled by conduction and the top ceramic layers 41, 43 and 45 are cooled by convection.

Typical specifications for a rectifier 20 include 0.001 minimum metallization including the copper plating thickness; a ceramic material composed of 99.5% beryllia; a 2.0° C./watt maximum thermal resistance junction through ceramic base layer; a 0.150" to 0.180" square silicon pellet for each rectifier chip; and the use of 10% tin, 90% lead solder or equivalent. Typical dimensions include ceramic base layer 21 having outside dimension of 1.2" by 1.625"; a thickness including metallization of about 0.1"; top ceramic layer 40 having a width of 0.5"; a length of 1.0" and a thickness of 0.05". The width of metallization 42 around top ceramic layer 41 can be about 0.4".

Various modifications and variations will no doubt occur to those skilled in the various arts to which this invention pertains. For example, the particular dimensions may be varied from that disclosed herein. Also, variations in the shape of the ceramic layers and the metallizations may be made from that disclosed herein. These and all other variations which basically rely on the teachings through which this disclosure has advanced the art are properly considered within the scope of this invention.

I claim:

1. A semiconductor full wave rectifier assembly for mounting in the alternator of an automobile including:
   a generally planar first lower ceramic base having two opposing major surfaces, a first metallization covering a portion of and being coextensive with one of said major surfaces and a second metallization covering a portion of the other of said major surfaces, the area of a major surface of said lower ceramic base being about 1.2 inches by about 1.625 inches thereby providing small size and low weight for the rectifier assembly;
   a second, third and fourth generally planar upper ceramic bases, each having two opposing major surfaces, the combined area of the major surfaces of said second, third and fourth ceramic bases being about equal to or less than the area of the major surfaces of said first lower ceramic base;
   a third, fourth and fifth metallization covering at least a portion of and being coextensive with one major surface of said second, third and fourth ceramic bases, respectfully, and each of said upper ceramic bases including an opening therethrough between said two major surfaces adapted to receive a lead extending therethrough for electrically coupling each of said third, fourth and fifth metallizations to the other side of said second, third and fourth ceramic bases, respectively;
   a first and second diode having opposing terminals connected to said third metallization so that forward current flow through said first and second diodes is in opposite directions with respect to said third metallization;
   a third and fourth diode having opposing terminals connected to said fourth metallization so that forward current flow through said third and fourth diodes is in opposite directions with respect to said fourth metallization;
   a fifth and sixth diode having opposing terminals connected to said fifth metallization so that forward current flow through said fifth and sixth diodes is in opposite directions with respect to said fifth metallization;
   said first, third and fifth diodes having terminals connected to said first metallization;
   said second, fourth and sixth diodes having terminals connected to said second metallization;
   said third, fourth and fifth metallizations each being adapted to be connected to one of the three output phase of the alternator;
   said first and second metallizations being adapted to provide a direct current output from said rectifier, said first metallization extending around an edge of said lower ceramic base and covering at least a portion of each of said two major surfaces, only one of said two opposing major surfaces being adjacent said diodes;

said upper and lower ceramic base being fabricated substantially of beryllia and having a sufficiently high heat transfer capability to cool said diodes during rectifying operation by providing for transfer of heat from said diodes through both said upper and said lower ceramic bases;

said metallization being molybdenum coated with copper so that the stress between the copper and the ceramic base due to thermal expansion is reduced; and said diodes being semiconductor wafers and being removable from said rectifier assembly without disturbing more than one other semiconductor wafer thus increasing yield by permitting a defective diode to be removed.

* * * * *